United States Patent [19]

Suzuki et al.

[11] 3,818,245

[45] June 18, 1974

[54] DRIVING CIRCUIT FOR AN INDICATING DEVICE USING INSULATED-GATE FIELD EFFECT TRANSISTORS

[75] Inventors: Yasoji Suzuki, Kawasaki; Masataka Hirasawa, Yokohama, both of Japan

[73] Assignee: Tokyo Shibaura Electric Company, Limited, Tokyo, Japan

[22] Filed: Jan. 5, 1973

[21] Appl. No.: 321,341

[52] U.S. Cl. .................. 307/251, 307/270, 307/304

[51] Int. Cl. .......................................... H03k 17/00

[58] Field of Search ........... 307/270, 304, 279, 251; 330/35; 340/336

[56] References Cited

UNITED STATES PATENTS

| | | | |
|---|---|---|---|
| 3,260,948 | 7/1966 | Theriault | 330/35 |
| 3,436,621 | 4/1969 | Crawford | 330/35 |
| 3,515,901 | 6/1970 | White | 307/313 |
| 3,518,454 | 6/1970 | French | 307/251 |
| 3,569,737 | 3/1971 | Bauer | 307/279 |
| 3,675,144 | 7/1972 | Zuk | 330/35 X |
| 3,723,749 | 3/1973 | Shapiro | 340/336 X |

*Primary Examiner*—Rudolph V. Rolinec
*Assistant Examiner*—D. P. Davis
*Attorney, Agent, or Firm*—Oblon, Fisher, Spivak, McClelland & Maier

[57] ABSTRACT

A driving circuit is disclosed which comprises first and second insulated-gate field effect transistors connected in series between two terminals of a power source. The gate of the first transistor is supplied with a bias potential and the gate of the second transistor is supplied with a driving signal. The power source voltage is selectively applied to an indicating device as a firing voltage under control of the second transistor. The first transistor normally operates in a saturated state. Accordingly the second transistor performs switching operations while being protected from the high voltage of the power source.

7 Claims, 4 Drawing Figures

DRIVING CIRCUIT FOR AN INDICATING DEVICE USING INSULATED-GATE FIELD EFFECT TRANSISTORS

BACKGROUND OF THE INVENTION

1. Field of the Invention

This invention relates generally to a driving circuit for an indicating device, and more particularly to a circuit which uses insulated-gate field effect transistors to operate as a high voltage driver.

2. Description of the Prior Art

Recently Digitron (TM) and Nixy (TM) tubes, for example, have been widely used as indicating devices in electronic desk top calculators. The Digitron tube is particularly popular at present but its driving voltage is very high in general. For example, the driving voltage is usually in the range from about 50V to 60V. Today, however it is desirable that elements such as insulated-gate field effect transistors (hereinafter called IGFET or simply FET or Transistor) for driving Digitron tubes be fabricated in chips of semiconductor materials forming integrated circuits (IC or LSI). It is therefore desirable to design FET circuits which could be used for driving Digitrons and the like, but is generally impossible to use the FET for such circuits because of the inherent properties of the FET. Namely, before the walk-out phenomenon, that is, the avalanche break-down voltage changes to a high value due to charging of the gate oxide layer of an FET as a result of electrons and positive holes in avalanche flying into the gate oxide layer, the avalanche break-down voltage of the FET is very low. For example, if an impurity concentration Nd of a semiconductor substrate of a FET is $9 \times 10^{14}$ $cm^{-3}$, and the thickness of the gate oxide layer of the FET is 2,000A, the avalanche break-down voltage of the FET is as low as about 45V before the walk-out phenomenon. Therefore the FET whose avalanche break-down voltage is about 45V could not drive the Digitron tube whose driving source must be from 50V to 60V. For better understanding of this problem, FIG. 1 shows theoretical and experimental data of the characteristic relations between avalanche break-down voltage $V_B$ (before the walk-out phenomenon) and the impurity concentrations of a semiconductor substrate, Nd and Na of P and N channel conductivity type FETs in the case where the thickness of gate oxide layer $d = 2{,}000$A and the gate voltage Vg is zero volts. In the calculation of the theoretical data, $\beta$ was set at 1.43 (determined by the thickness of the gate oxide layer and the dielectric constant of the silicon substrate) and the thickness of the gate oxide layer $do = 0.36$ $\mu$m (P channel type) while $do = 0.28$ $\mu$m (N channel type). It is apparent that the avalanche break-down voltage of a FET which has been fabricated using integrated circuit manufacturing techniques is distributed near approximately 45V.

If it is desired to fabricate an IC or LSI including a driving circuit for an indicating tube using one or more FETs, however, it is necessary in the manufacturing steps to evelate the avalanche break-down voltage. For example, one counter-measure is that of increasing the thickness of the gate oxide layer, so than an IC or LSI indicating tube driving circuit including a FET can be manufactured. However, the above described counter-measure will have a bad influence on other circuit elements fabricated in the same semiconductor chip with the driving cirucit, since the threshold voltage of these elements will undesirably become a high voltage. Thus, if the driving circuit and another logic circuit are fabricated together in the same chip using the above described countermeasure, the other logic circuit may lose its properties because the threshold voltage becomes too high. A manufacturing method wherein the thickness of the gate oxide layer is increased only for the FET in the driving circuit was considered, but this method requires two manufacturing steps for forming oxide layers, one of which is for the driving circuit and the other of which is for the other logic circuit. Thus, this method is not practical, since it requires additional complex manufacturing steps.

SUMMARY OF THE INVENTION

Accordingly, one object of this invention is to provide a novel driving circuit for an indicating device which uses an insulated-gate field effect transistor whose avalanche break-down voltage is elevated in the usual manufacturing steps.

Another object of this invention is to provide a novel FET driving circuit which can drive a high voltage indicating device.

Another object of this invention is to provide a novel integrated circuit which comprises a driving circuit and another logic circuit.

Another object of this invention is to provide a novel driving circuit, the driving voltage of which can be easily controlled.

Another object of this invention is to provide a novel integrated circuit including insulated-gate field effect transistors wherein a high voltage driving circuit is provided without undesirably influencing another circuit fabricated in the same integrated circuit.

Briefly, according to the present invention these and other objects are achieved by providing a driving circuit for an indicating device using insulated-gate field effect transistors comprising a first insulated-gate field effect transistor of one channel conductivity type whose gate is supplied with a bias potential to operate in the saturation area. A second insulated-gate field effect transistor of the same channel conductivity type is also provided whose gate is supplied with a driving signal as an input signal. A series connection is provided between the first and second transistors including a first connection between one terminal and the first transistor providing an output signal to drive an indicating device. A second common connection is provided between the first transistor and the second transistor, and a third connection is provided between the second transistor and another terminal. Both transistors are coupled in series across a driving source.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
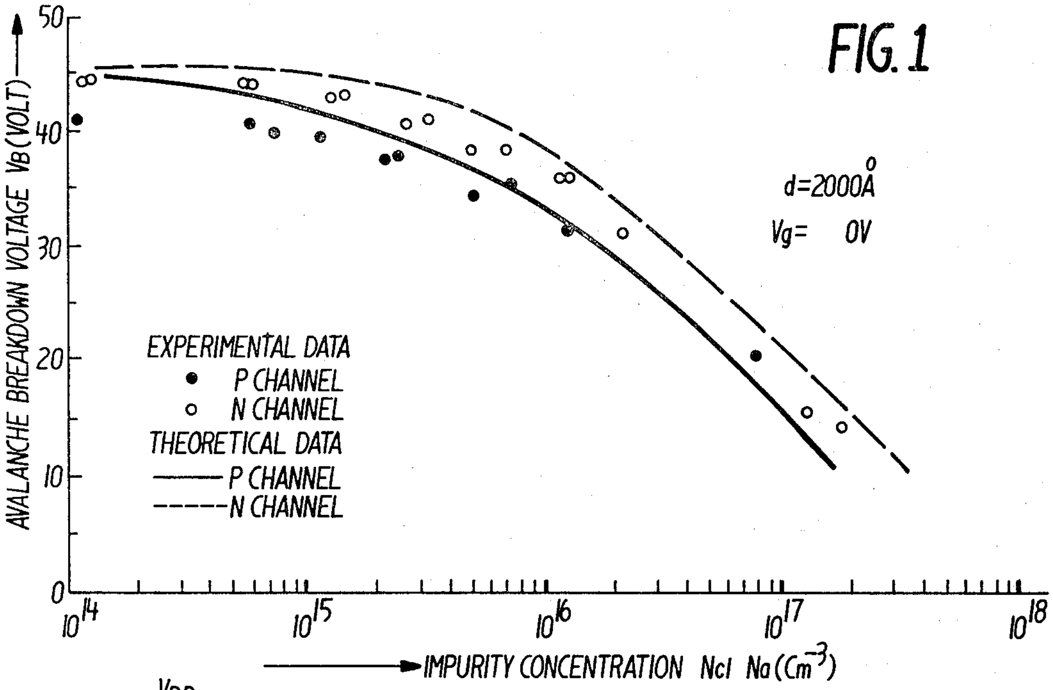
FIG. 1 is a graphical diagram illustrating the characteristic curves of the FET used in the present invention and showing the relationships between avalanche break-down voltage and impurity concentration in channels of P and N conductivity type.
Figure 2:
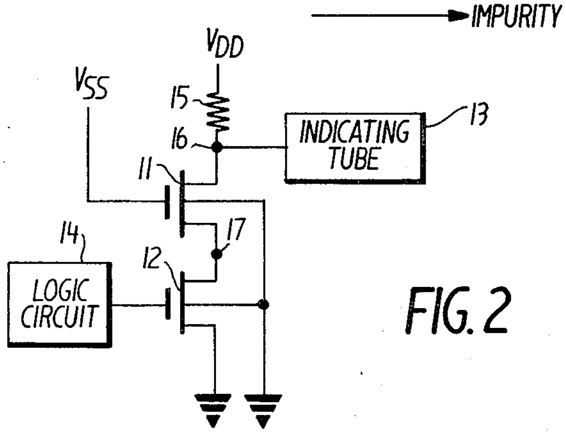
FIG. 2 is a schematic diagram of one embodiment of the circuit of this invention illustrating a driving circuit including two FETs and a load resistor.

Referring now to the drawings, wherein like reference numerals designate identical or corresponding parts throughout the several views, and more particularly to FIG. 2 thereof, the basic driving circuit of this invention is shown.

A resistor 15 and FETs 11 and 12 are shown connected in series between two terminals $V_{DD}$ and the earth or negative potential of a driving source. The driving source is called the "high voltage source," hereinafter, because while IGFETs in integrated circuits usually require only several volts as a driving source, this invention uses 50V to 100V as a driving source for an indicating tube. An indicating tube 13 such as a Digitron tube, for example, is connected to a node 16 of the load resistor 15 and the FET 11 as an output. Instead of the indicating tube, a plasma display device may be used, when devices of this type are required as indicating devices. The FET 11 is supplied at its gate with a predetermined bias voltage $V_{SS}$ (negative voltage) and the other FET 12 is supplied at its gate with a driving signal, such as an input from a logic circuit 14. The logical information used as an input signal controls the application of power from the high voltage source $V_{DD}$ to the indicating tube 13 to drive it in accordance with ON and OFF switching of the FET 12 determined by the logical information. The drain of the FET 11 is connected through the load resistor 15 to the driving source $V_{DD}$. The node 16 of the resistor 15 and the drain of the FET 11 is connected as a first output to the indicating tube 13. The source electrode of the FET 11 is also connected to the drain of the FET 12, forming a second output. Furthermore, the source of the FET 12 is connected to earth potential and the substrate of the FETs 11 and 12 is also connected to the earth potential respectively. It is noted that the source, drain, gate and substrate electrodes of the FETs 11 and 12 are simply described above as the source, drain, gate and substrate.

In this configuration, since the source voltages used herein are related such that $|V_{SS}| \leqq |V_{DD}|$ in general, the FET 11 is ON when the FET 12 is OFF, so that:

$$|V_{DD}| > |V_{SS} - V_{th11}| \quad (1)$$

wherein $V_{th11}$ is the threshold voltage of the FET 11.

Therefore, the FET 11 always operates in the saturation area. In order to supply the gate of the FET 11 with the bias potential $V_{SS}$, the first and second FETs 11 and 12 are directly connected together through the forward resistor of the FET 11, because the FET 11 is ON. Thus, the potential of the second output 17 becomes $|V_{ss} - V_{th11}|$ for saturation operation of the FET 11. As a result, there is no problem of over supplying the gate oxide layer of the FET 12 with a voltage greater than the avalanche break-down voltage, since the voltage supplied at the drain of the FET 12 is $|V_{SS} - V_{th11}|$ and there exists the relation $|V_{SS}| \leqq |V_{DD}|$. Even if $V_{SS} = V_{DD}$ and $V_{SS}$ is the avalance break-down voltage, there is no risk that the drain voltage of FET 12 may be the attenuated threshold voltage $V_{th11}$ of the FET 11. Especially if the bias potential $V_{SS}$ approaches that of the driving source $V_{DD}$, a more favorable result will occur because of the increasing absolute value of the threshold voltage $V_{th11}$. For example, when it is assumed that the impurity concentration of the substrate $Nd \approx 6 \times 10^{14}$, the thickness of the gate oxide layer $d$ = 2,000A, the bias potential $V_{SS} = -24V$ and the driving source $V_{DD} = -60V$, the threshold voltage of the FET 11, $V_{th11}$ becomes about −7V, and then the drain of the FET 12 is supplied with −17V. On the other hand the voltage between the source and the drain of the FET 11 is:

$$|V_{out1} - V_{out2}| = |V_{DD} - (V_{SS} - V_{th11})| \text{ TM } (2)$$

wherein $V_{out1}$ is the potential of the first output 16 and $V_{out2}$ is the potential of the second output 17.

It is apparent from the equation (2) that the voltage supplied to the FET 11 is small even when the avalanche breakdown voltage is over the driving source $V_{DD}$. The numerical value of the equation (2), applying above described values, for example, is:

$$|V_{out1} - V_{out2}| = |-60 - (-24 + 7)| = |-43|$$

The supplied voltage of the FET 11 is −43V, which is less than the avalanche break-down voltage (about 45V) of the usual FET. This explanation assumes that the FET 12 is OFF, but when the FET 12 is ON, it is apparent that there is no problem about the avalanche break-down voltage.

Figure 3:
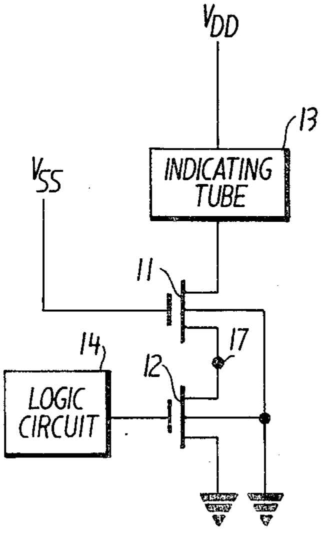
FIG. 3 is a schematic diagram of another embodiment of the circuit of the present invention, showing a driving circuit connected in series with an indicating device.

In the above described embodiment, the drain of the FET 11 is connected through the load resistor 15 to the driving source $V_{DD}$, and the node 16 of the drain and the resistor 15 is connected to the indicating tube 13. However without limitation of this embodiment, another embodiment of the invention is illustrated in FIG. 3 wherein the drain of the FET 11 is connected through the indicating device 13 to the driving source $V_{DD}$.

Figure 4:
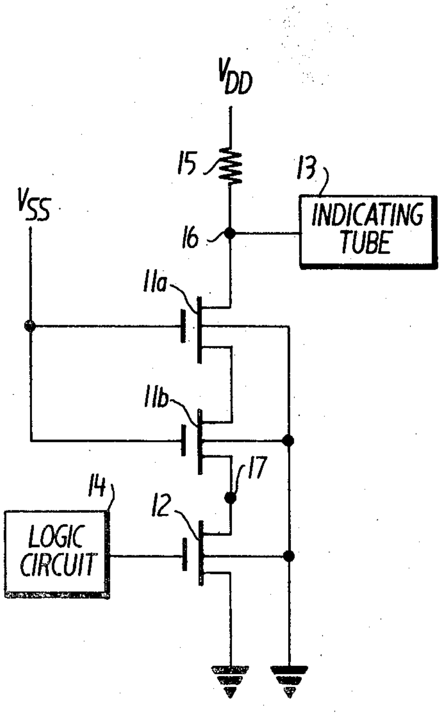
FIG. 4 is a schematic diagram of yet another embodiment of the circuit of the present invention, showing a driving circuit for a high voltage driving source using a plurality of FETs operable in the saturation area.

Furthermore, if the driving source used is desired to be more than that of the first embodiment in absolute value, a preferred embodiment for such purpose is illustrated in FIG. 4. FETs 11a and 11b, which operate always in the saturation area, are connected in series to be able to endure a backward voltage across the PN junction of the FET 12. It is easily understood that further FETs operable in saturation area may be connected in series with the FETs *11a* and *11b* for constructing even higher voltage driving sources.

It is pointed out that, although all of the illustrated embodiments use P channel conductivity FETs, the invention has the same advantages when N channel conductivity type FETs are used instead of P channel FETs.

Furthermore, all of the above embodiments are described as drivers for indicating tubes such as Digitrons. However, this invention is not limited to use with indicating tubes. For example, MOS integrated circuits including the driving circuit of this invention may be advantageously used as high voltage drivers for virtually any purpose.

Obviously, numerous additional modifications and variations of the present invention are possible in light of the above teachings. It is therefore to be understood that within the scope of the appended claims, the invention may be practiced otherwise than as specifically described herein.

What is claimed as new and desired to secure by letters patent of the United States is:

1. A driving circuit for an indicating device using insulated-gate field effect transistors comprising:

a first insulated-gate field effect transistor of one channel conductivity type whose gate is supplied with a bias potential;

a second insulated-gate field effect transistor of said one channel conductivity type whose gate is supplied with an input logic driving signal;

a series connection of said first and second transistors including a first connection between an output terminal and said first transistor providing an output signal to drive an indicating device, a second common connection between said first transistor and said second transistor, and a third connection between said second transistor and a second terminal; and a power source having a voltage magnitude greater than avalanche breakdown of said first and second transistors connected across said first and second transistors wherein said bias potential is of a magnitude which maintains said first transistor in saturation when said second transistor is in an off condition whereby avalanche breakdown in each of said transistors is prevented.

2. A driving circuit for an indicating device using insulated-gate field effect transistors as in claim 1, further comprising:

a load resistor coupled between said power source and said output terminal.

3. A driving circuit for an indicating device using insulated-gate field effect transistors as in claim 2, wherein:

said indicating device is coupled to said load resistor and to said first transistor.

4. A driving circuit for an indicating device using insulated-gate field effect transistors as in claim 1, wherein:

said indicating device is coupled in series between said power source and said first transistor.

5. A driving circuit for an indicating device using insulated-gate field effect transistors as in claim 1, further comprising:

a third transistor coupled to said first transistor and through said common connection to said second transistor.

6. A driving circuit for an indicating device using insulated-gate field effect transistors as in claim 5, further comprising:

a load resistor coupled between said power source and said output terminal.

7. A driving circuit for an indicating device using insulated-gate field effect transistors as in claim 5, wherein:

said indicating device is coupled in series between said power source and said first transistor.

* * * * *